United States Patent [19]
James et al.

[11] Patent Number: 5,196,395
[45] Date of Patent: Mar. 23, 1993

[54] METHOD FOR PRODUCING CRYSTALLOGRAPHIC BOUNDARY JUNCTIONS IN OXIDE SUPERCONDUCTING THIN FILMS

[75] Inventors: Timothy W. James; Julia S. Fleming, both of Goleta, Calif.

[73] Assignee: Superconductor Technologies, Inc., Santa Barbara, Calif.

[21] Appl. No.: 664,586

[22] Filed: Mar. 4, 1991

[51] Int. Cl.$^5$ .......................... B05D 5/12; H01L 39/22
[52] U.S. Cl. ........................................ 505/1; 505/702; 505/728; 505/701; 505/732; 427/62; 427/63; 427/309; 357/5; 156/637
[58] Field of Search ................... 505/1, 702, 703, 728, 505/731, 732, 846; 427/62, 63, 309; 324/248; 357/5; 156/637

[56] References Cited

U.S. PATENT DOCUMENTS 4,964,945 10/1990 Calhoun ............................. 158/632
4,985,117 1/1991 Kurosawa et al. .............. 156/659.1

FOREIGN PATENT DOCUMENTS

0291050A2 11/1988 European Pat. Off. .
2-260473 10/1990 Japan .

OTHER PUBLICATIONS

Laibowitz et al, "All high edge junctions and SQUIDS" Appl. Phys Lett. 5617) Feb. 1990 pp. 686–688.
Tanabe et al, "Grain Boundary Jospehson Junctions Using Y-B$_a$-C$_u$-O films operative at 77K", Jpn. J. Appl. Phys. 26(12) Dec. 1987 pp. L1961-1963.
Daly, K. P. et al, "YBa2Cu3O7 Step-Edge RF Squid Biased at 10 GHz", IEEE Transaction on Magnetics, vol. 27, No. 2, Mar. 1991, pp.1–4.
Cui, G. J. et al, "Characterization of RF-Squids Fabricated From Epitaxial YBa2Cu3O7 Films", "Nonlinear Superconductive Electronics and Josephson Devices", Jan. 1991, Plenum Press, pp. 1–9.

Primary Examiner—Shrive Beck
Assistant Examiner—Roy V. King
Attorney, Agent, or Firm—Lyon & Lyon

[57] ABSTRACT

A method for generating repeatable and reproducible crystallographic grain-boundary junctions is provided by forming a film on a crystalline substrate which has intersecting faces. In a preferred embodiment, a single crystal substrate is etched by an anisotropic etchant to provide a "V"-groove in one face, and an epitaxial superconducting film is grown on the faces of the V-groove. In another preferred embodiment, a step is etched with an anisotropic etch, and an epitaxial superconducting film grown on the step. Grain-boundary junctions are formed at the points of intersection of the faces with each other, or with the faces and the surface of the substrate. The film may be patterned and etched in the area of the boundary junction to form useful devices.

11 Claims, 4 Drawing Sheets

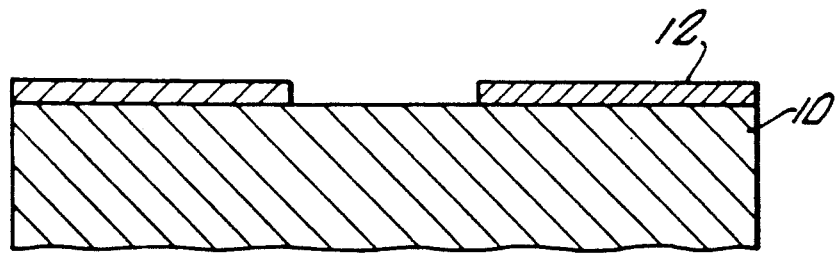
*FIG_1a.*
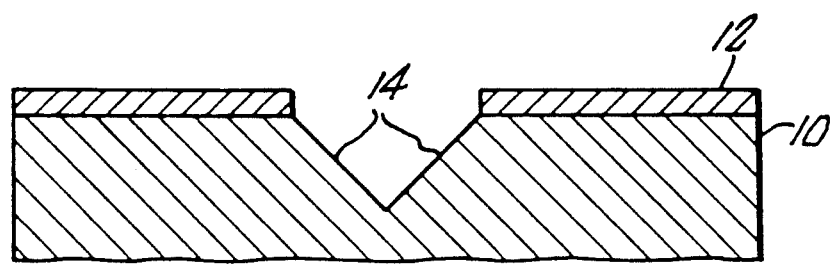
*FIG_1b.*
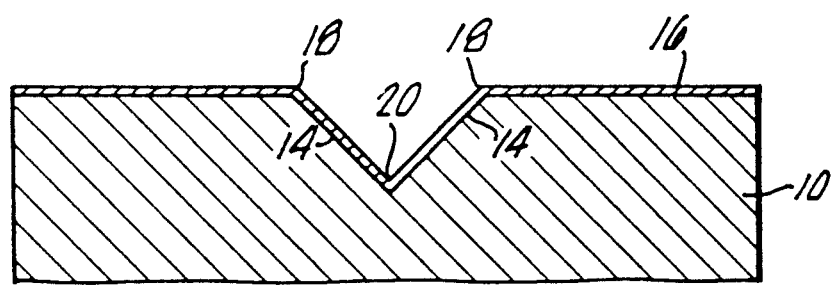
*FIG_1c.*
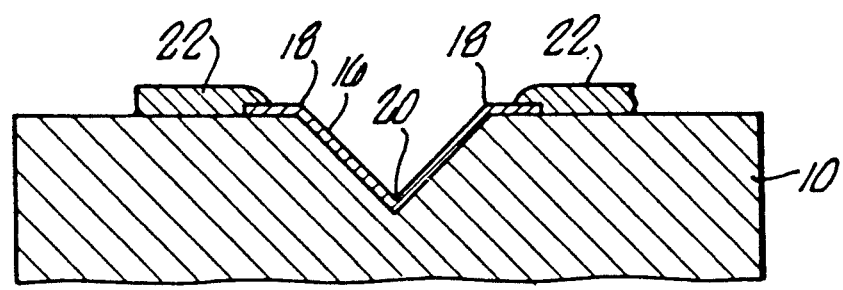
*FIG_1d.*

METHOD FOR PRODUCING CRYSTALLOGRAPHIC BOUNDARY JUNCTIONS IN OXIDE SUPERCONDUCTING THIN FILMS

This invention was made with Government support under Contract No. F19628-89-C-0125 awarded by the Air Force Systems Command, Electronic Systems Division, Hanscom AFB. The Government has certain rights in this invention.

DESCRIPTION

1. Field of the Invention

This invention relates to devices from and methods for manufacturing useful articles from superconducting materials. Specifically, it relates to devices from and methods for generating controlled grain boundaries at defined locations in superconducting thin film materials by forming the film on anisotropically etched substrates.

2. Background of the Invention

The phenomenon of superconductivity was first observed by Kamerlengh Onnes in 1911. Superconductivity refers to that state of metals and alloys in which the electrical resistivity is zero when the specimen is cooled to a sufficiently low temperature. The temperature at which a specimen undergoes the phase transition from a state of normal electrical resistivity to a superconducting state is known as the critical temperature ("$T_c$"). Until recently, the $T_c$ in known superconducting materials was relatively low, requiring expensive cooling apparatus, including the use of liquid helium.

Starting in early 1986, with the announcement of a superconducting material having a $T_c$ of 30K (See e.g., Bednorz and Muller, Possible High Tc superconductivity in the Ba-La-Cu-O System, Z.Phys. B-Condensed Matter 64, 189–193 (1986)) materials having a relatively high transition temperature have been announced. Currently, superconducting materials exist which have a $T_c$ well in excess of the boiling point of liquid nitrogen, 77K at atmospheric pressure, a relatively inexpensive and simple to use coolant.

Initially, compounds which exhibited superconductivity at temperatures above 77K were based on the combination of alkaline earth metals and rare earth metals such as barium and yttrium in conjunction with copper, typically referred to as YBCO compounds. See, e.g., Wu, et al. Superconductivity at 93K in a New Mixed-Phase Y-Ba-Cu-O Compound System at Ambient Pressure, Phys. Rev. Lett., Vol. 58, No. 9, pp. 908–910 (1987). After the YBCO compounds, compounds containing bismuth were discovered. See, e.g., Maeda, A New High-Tc Oxide Superconductor Without a Rare Earth Element, J. J. App. Phys. 37, No. 2, pp. L209–210 (1988) and Chu, et al, Superconductivity up to 114K in the Bi-Al-Ca-Br-Cu-O Compound System Without Rare Earth Elements, Phys. Rev. Lett. 60, No. 10, pp. 941–943 (1988).

Starting in early 1988, thallium based superconductors have been prepared, generally where the compositions have various stoichiometries of thallium, calcium, barium, copper and oxygen. To date, the highest transition temperatures for superconductors have been observed in thallium containing compounds. Six different superconducting phases have been identified. See, e.g., G. Koren, A. Gupta and R. J. Baseman, Appl.Phys.-Lett. 54, 1920 (1989). The transition temperatures range from 90K for $TlCaBa_2Cu_2O_x$ (the "1122 phase") to 123K for $Tl_2Ca_2Ba_2Cu_3O_x$ (the "2223 phase"). Additionally, a number of different thallium based compounds have been identified, some of which include lead. All of these compounds will be collectively referred to as thallium containing superconductors.

Thallium containing superconductors have been prepared in a number of forms. The earliest forms were preparation of bulk materials, which were sufficient to determine the existence of the superconducting state and phases. More recently, thin films of thallium superconductors have been formed on various substrates. More particularly, the applicant's assignee has successfully produced thin film thallium superconductors which are epitaxial to the substrate. See, e.g., Preparation of Superconducting TlCaBaCu Thin Films by Chemical Deposition, Olson et al., Applied Physics Letters 55, (2), 10 Jul. 1989, pp. 189–190, incorporated herein by reference. Techniques for fabrication of thin film thallium superconductors are described in the commonly assigned copending applications: Superconductor Thin Layer Compositions and Methods, Ser No.: 238,919, filed Aug. 31, 1989, now U.S. Pat. No. 5,071,830; Liquid Phase Thallium Processing and Superconducting Products, Ser. No.: 308,149, filed Feb. 8, 1989, now abandoned; Controlled Thallous Oxide Evaporation for Thallium Superconductor Films and Reactor Design, Ser. No.: 516,078, filed Apr. 27, 1990, now U.S. Pat. No. 5,139,998; and In Situ Growth Superconducting Films, Ser. No.: 598,134, filed Oct. 16, 1990, now abandoned, all incorporated herein by reference.

In 1962 Brian Josephson predicted that there was a certain probability that electrical current could tunnel from one superconductor to another, even though separated by an insulator. The Josephson effect, as it is now called, won a Nobel prize for Josephson. The link between the superconductors is known as a "weak link", and has been observed in many forms. Weak link devices have been formed where there is a short constriction in the cross section of a superconductor, a point contact between two superconductors, or some sort of crystallographic boundary junction existed between two or more superconductors.

A number of useful devices using Josephson or "weak link" junctions exist. For example, a device called a SQUID, a superconducting quantum interference device, consists of a ring of superconducting material having weak link junctions through the ring. Very sensitive galvanometers and magnetometers may be constructed using SQUIDs. Another useful device is a superconducting tunnel junction, consisting of separate superconductors separated by a non-superconductor, such as an insulator.

Heretofore, manufacture of devices which utilize weak link junctions in high temperature superconductors consisted broadly of the following steps. First, a superconductor containing a junction is formed by any one of a number of techniques, described in more detail below. Secondly, the desired device is patterned relative to the junction using photolithographic techniques. A significant disadvantage of this technique is that it is virtually impossible to predict the location of the junction prior to its formation. With this technique, the junction must be completely formed as a first step, and only then can the location for patterning of the device be determined.

The three principal known techniques for generation of crystallographic grain-boundary junctions will now be described.

The first commonly used technique for formation of junctions is to form break junctions. A superconducting material is stressed such that it separates slightly in a certain region, though does not necessarily break all together. The slightly separated pieces are then physically placed back in contact, thereby creating a break junction where the separation had occurred. The significant drawbacks of the break junction technique are that it is difficult, if not impossible, to repeatable and precisely locate the position of the boundary junction, and that devices made by this technique are prone to temperature and vibration problems.

A second technique for generating crystallographic grain-boundary junctions consists of forming the epitaxial layer on a polycrystalline substrate. By starting with a substrate which is essentially polycrystalline, and then growing epitaxial thin films on the substrate, grain-boundary junctions are created in the epitaxial layer above the intersection of the various crystalline regions in the substrate.

Various types of essentially polycrystalline substrates may be used. For example, polycrystalline substrate material is commercially available, having relatively random crystalline structure. The disadvantage of using such a polycrystalline substrate is that the boundaries are not identical, as they have various degrees of tilt and rotation, and therefore are not reproducible. An alternative to the truly polycrystalline substrate is to create an intersection of two or more single crystal substrates by cutting them at an angle, polishing and rejoining then by heating the crystals. In this way, a fairly well defined, and straight, crystallographic boundary is created in the substrate, thereby permitting formation of a fairly well located and defined crystallographic boundary junction in the epitaxial film grown on the substrate. The disadvantages of this technique are that it is relatively time consuming to make the substrate, the boundaries are not always clean, the boundaries must traverse the whole film and excessive material is used for generation of a single boundary.

A third technique for generation of crystallographic grain-boundary junctions consists of generating discontinuities in the thin film during the growth of the epitaxial layer on a substrate. Starting with a single crystal substrate, a thin film is grown with process conditions such that multiple regions or multiple epitaxial orientations are formed. The disadvantages of this technique are that the location of the boundary junction is relatively random, thereby making the structure difficult to predict and not repeatable.

To date, no one has reported the manufacture of tunnel junctions in materials with a superconducting $T_c$ above 77K. The coherence length (the distance over which the Josephson effect can be observed) for high temperature superconductors tends to be very short, on the order of 10 Angstroms. This requires precision in the placement of the junction to the same scale as the coherence length. None of the techniques utilized previously have sufficient precision to manufacture high temperature superconductor tunnel junctions. All high temperature superconducting junctions prior to this invention have been based on the weak link properties between adjacent high-$T_c$ crystals.

All of the techniques described above are believed to not be viable production oriented techniques. Generally, it is difficult if not impossible to determine exactly where the crystallographic boundary junction will be formed with these techniques. Significant waste of material can occur using this technique.

SUMMARY OF THE INVENTION

Crystallographic boundary junctions are created by forming an epitaxial film on a crystalline substrate which has intersecting faces. Typically, a single crystal substrate is etched to provide a "V"-groove or step structure in a face, and an epitaxial superconducting film is grown on the substrate. Grain-boundary junctions are formed at the points of intersection of the faces with each other, or with the faces and the surface of the substrate. Planar faults are formed in the superconducting film at these intersections principally because the superconducting material has a different symmetry than does the underlying substrate. For example, superconducting materials typically have tetragonal or orthorhombic symmetry, whereas compatible substrate typically have cubic or pseudo-cubic symmetry. Generally, planes that are equivalent in cubic symmetry are not equivalent in tetragonal or orthorhombic symmetry. Because of the nonequivalence of the planes, the superconducting thin film in the location of the intersection becomes a grain-boundary junction.

In the preferred embodiment of this technique, a single crystal substrate is etched to form intersecting planes, such as a groove or a step. Any technique which provides nonparallel, intersecting faces is compatible with this invention. One preferred technique uses conventional lithographic masking and etching. Since the etchant used for the substrate, such as sulfuric acid and phosphorous acid, is typically not compatible with organic photoresist, an inert mask, such as of gold, is patterned on the substrate. By varying the orientation of the mask, different crystallographic faces will be preferentially exposed by the etch. The inert mask is used with a highly anisotropic etch to provide the intersecting faces. After the faces are formed, an epitaxial thin film layer is grown over the substrate. The epitaxial layer is optionally lithographically processed to pattern the device and remove excess material. Appropriate electrical interconnections may then be made to the superconducting epitaxial layer.

A number of useful superconducting structures may be constructed utilizing the techniques of this invention. For example, a V-groove SQUID ("V-SQUID") consists of a SQUID formed using the boundary junctions at the bottom of a V-groove in a substrate. Alternatively, serially interconnected set of junctions may be formed on a series of faces. Further, a superconducting Josephson effect mixer may be patterned using the boundary junction.

Accordingly, it is a principle object of this invention to provide a technique for production volume manufacturing of crystallographic boundary junctions in high temperature superconducting films.

It is a further object of this invention to manufacture repeatable and reproducible boundary junctions in superconducting materials.

It is yet a further object of the invention to provide a novel structure for a SQUID.

It is yet a further object of the invention to provide a novel structure for a Josephson effect mixer.

DESCRIPTION OF THE DRAWINGS

FIGS. 1a, 1b, 1c and 1d show the preferred process steps for generation of a crystallographic boundary junction device.

DETAILED DESCRIPTION

Figure 2:
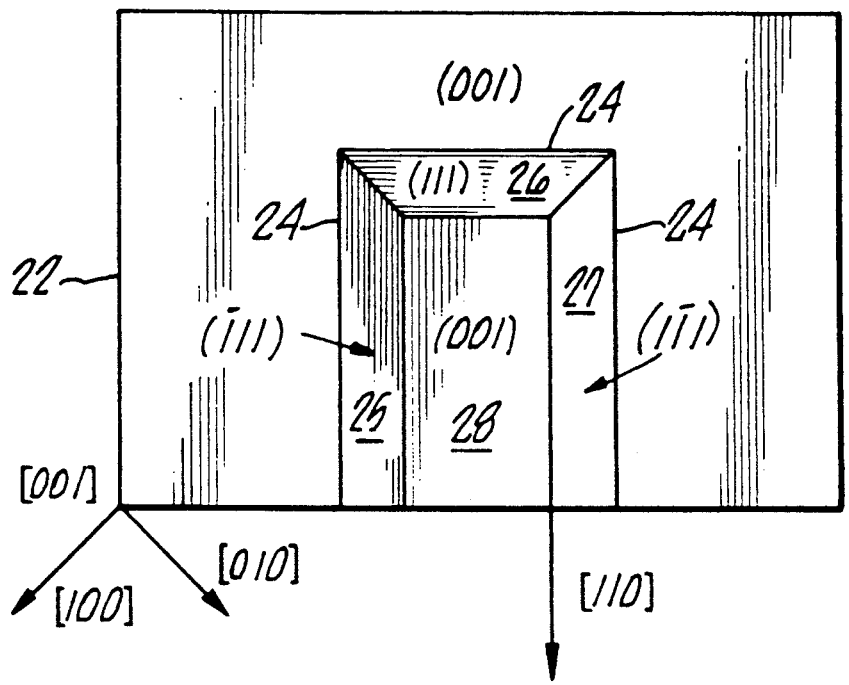
FIG. 2 shows a perspective view of etched $LaAlO_3$ with exposed faces.

In accordance with this invention, it is necessary to find or generate nonparallel, intersecting faces in the substrate. Any technique which is capable of generating or finding such a structure in a substrate is compatible with this invention. In the preferred embodiment, chemical etching is used to generate the intersecting crystallographic faces in the substrate. Then, an epitaxial superconductor is grown on the substrate, by any desired technique. Finally, if desired, the superconductor may be patterned to provide useful devices, such as SQUIDs or Josephson effect mixers.

FIG. 1 shows the preferred process steps of (a) masking, (b) etching, (c) depositing the superconductor and (d) patterning the superconductor and providing metal contacts. These steps will be generally described in connection with FIGS. 1A-1D.

First, as shown in FIG. 1A, a substrate 10 on which the boundary junction will be formed is masked with an inert material. The substrate 10 may be of any material which is compatible with superconducting thin film materials, such as lanthanum aluminate, magnesium oxide, yttria-stabilized zirconia, strontium titanate, sapphire or silicon. The discussion of the technique may be made independently of the substrate material used. Masking serves to leave exposed those areas to be etched. Because most organic photoresist materials are incompatible with substrate etchants, the mask for the substrate etch must be made from a material relatively inert to the etchant. For example, a gold or gold or titanium/tungsten layer 12 may be deposited on the substrate 10. The mask may be patterned using any conventional technique, such as photolithography or lift-off techniques.

Second, with reference to FIG. 1b, the substrate 10 is etched, exposing crystallographic faces 14. The faces provide intersecting planes to the surface of the substrate 10. Preferably, a highly anisotropic etch is used. This will expose the faces which are slowest to react to the etch. The particular faces which are exposed will depend upon the orientation of the mask. After etching, the mask 12 is typically removed.

Third, with reference to FIG. 1c, a high temperature superconductor 16 is epitaxially grown on the substrate 10, including over the faces 14. Since the symmetry of the substrate 10 is different that the symmetry of the superconductor 16, planar faults will exist at those locations 18 where the faces 14 intersect the surface of the substrate 10, and at the groove 20 where the faces 14 intersect. Any technique which permits epitaxial growth of a superconductor on the substrate, such a deposition of an amorphous film followed by post-deposition thermal processing, may be used.

Finally, as shown in FIG. 1d, the superconductor 16 may be etched to provide the desired useful device. Any desired technique for patterning, such as photolitography, and etching may be utilized consistent with the objects of this invention. Appropriate electrical contacts 22 are provided for connection of the device to other devices, or to the outside world. In the device shown in FIG. 1d, junction boundaries exist at the locations 18 and the groove 20.

FIG. 2 shows a plan view of a structure obtained in lanthanum aluminate ($LaAlO_3$) substrate 22. Lanthanum aluminate has pseudo-cubic symmetry. The [001] plane of the substrate 22 is in the plane of the page, as indicated by the orientation arrows in the lower left hand corner of FIG. 2. In the structure shown, the etch mask consisted of a slot covering the substrate 22 in the regions exterior to boundary 24. The mask boundary is oriented along the [110] azimuth, as shown by the orientation arrow. Utilizing an anisotropic etch will selectively expose the slowest etching crystallographic faces, which for lanthanum aluminate are the (111) and (100) faces. With the mask as describe, the etch will expose the $(\bar{1}11)$ face 25, the (111) face 26, the $(1\bar{1}1)$ face 27 and the (001) face 28. The substrate in the region 28 is lower than the substrate which has not been etched.

Figure 3:
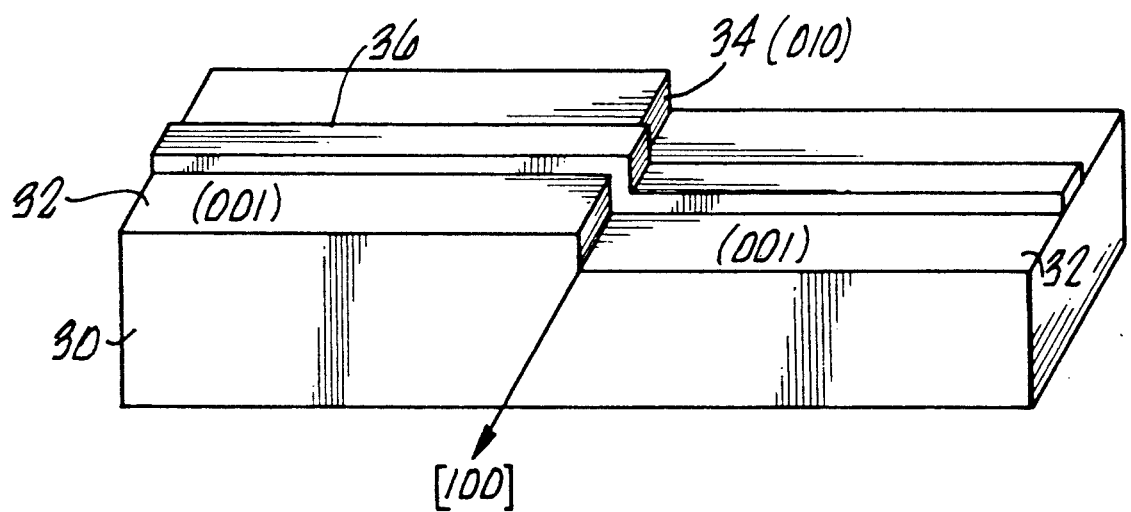
FIG. 3 shows a perspective view of a device with weak link junctions on a step structure.

FIG. 3 shows a perspective view of a superconductive device containing weak link faults on lanthanum aluminate. In this case, the mask (not shown) was oriented along the [100] azimuth, shown by the orientation arrow. A step structure results, with the (001) tred face 32 and the (010) kick face 34 exposed. For lanthanum aluminate, an anisotropic etch solution of 1/5 concentration sulfuric acid and 4/5 concentrated phosphorous acid has proved effective in giving smooth sided and few irregularities. An optimum rate of etching was achieved at 85 C. The etch rate was approximately 7000 A per hour, with slight variation in etch rate between samples. A Au/TiW mask was used to protect the substrate 30 in areas not to be etched.

A patterned epitaxial film 36 of $Tl_2CaBa_2Cu_2O_8$ (2122 phase) was formed by laser deposition of a mixed oxide target, followed by a post-deposition thermal process. After deposition, the film is patterned by any suitable technique, such as photolithographic masking and etching. Two grain-boundary junctions are formed in the epitaxial superconductor 36 at the intersections of the tred face 32 with each of the kick faces 34.

Figure 4:
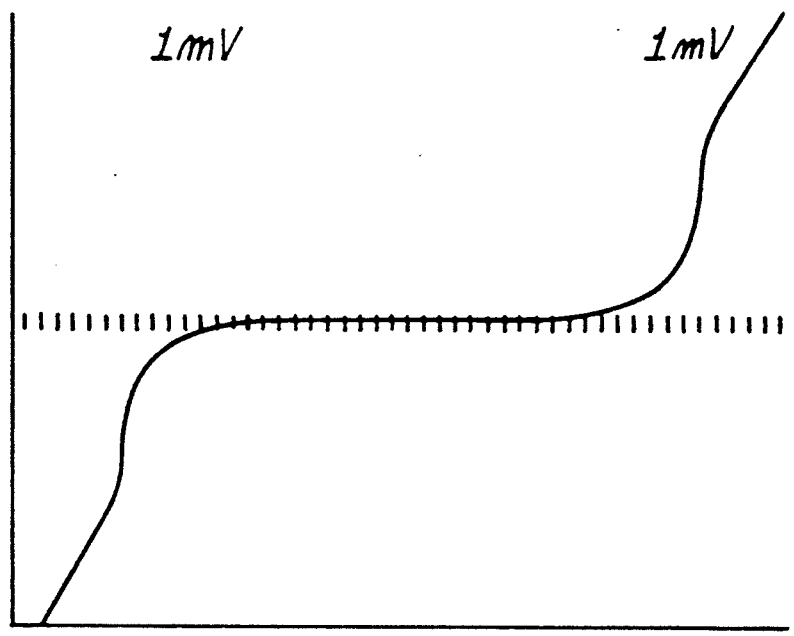
FIG. 4 shows a graph of a current versus voltage plot for a weak link grain boundary Josephson junction.

FIG. 4 shows a current versus voltage characteristics for a weak link grain boundary Josephson junction formed by the above described technique. The 2122 phase thallium superconductor film had a nominal thickness of 1 micron, and the kick face 34 which was vertical having a height of 5300 A. The horizontal scale of FIG. 4 is current with one division representing 20 microamps, and the vertical scale is voltage, with one division representing 1 mV/division.

Figure 5:
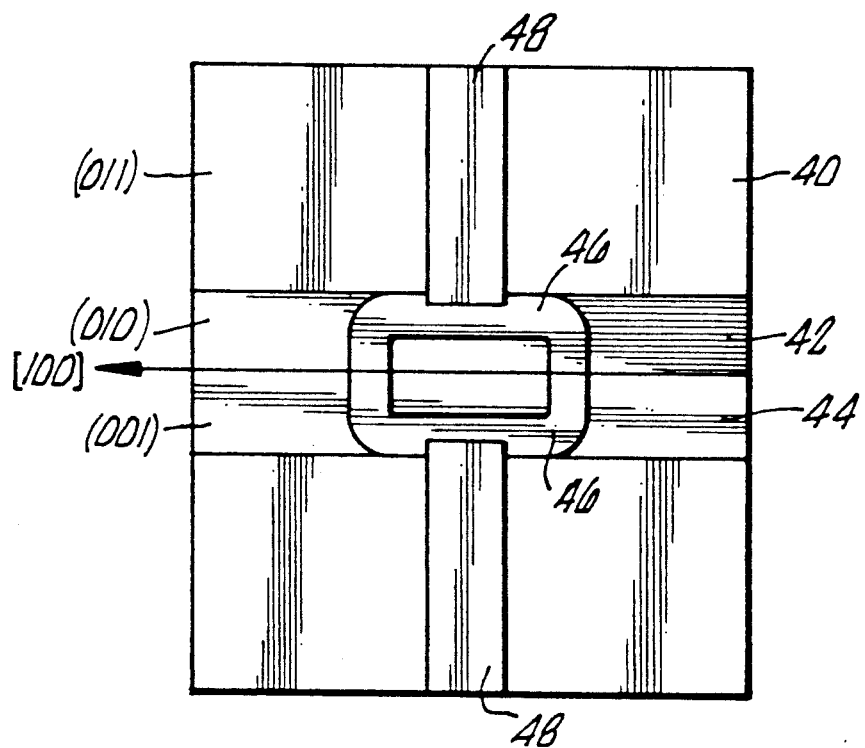
FIG. 5 shows a plan view of a SQUID.

A plan view of a SQUID using junctions formed by the technique of this invention is shown in FIG. 5. The substrate 40 has faces 42 and 44 etched in the substrate. If a lanthanum aluminate substrate is used, the exposed face 42 could be the (010) face and the face 44 could be the (001) face. An epitaxial thin film 46 is patterned to provide a conventional SQUID structure, with weak link junctions being formed at the intersections of the face 42 and the face 44. Electrical contacts 48 are made to the epitaxial layers 46 by contact metallization lines.

Figure 6A:
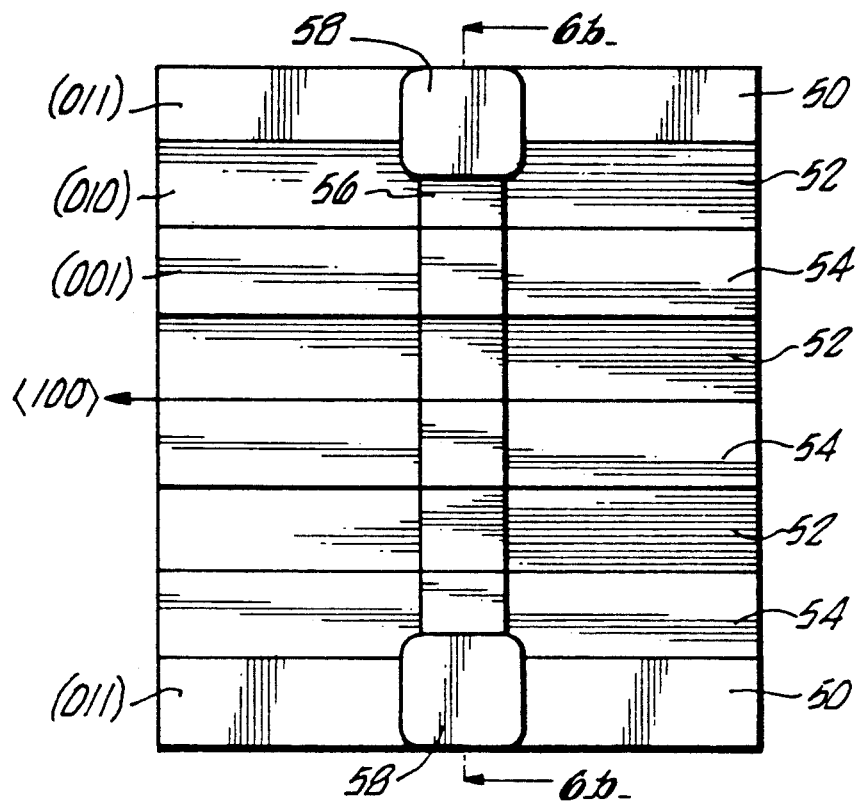
FIG. 6a shows a plan view of serially interconnected junctions.
Figure 6B:
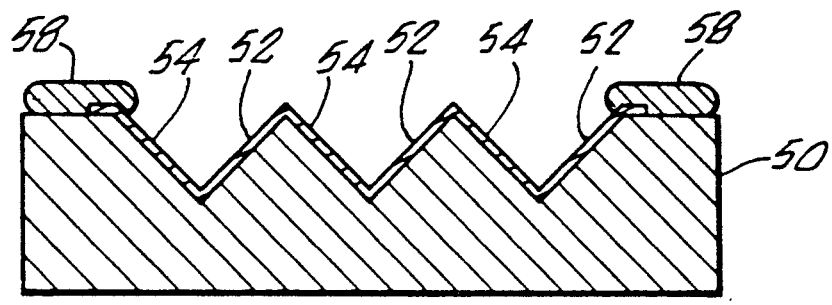
FIG. 6b shows a cross-sectional view of serially interconnected junctions.

Another structure which may be readily constructed using the technique of this invention is that of a serially interconnected set of junctions, as shown in FIG. 6. A substrate 50 is etched to provide a plurality of pairs of opposing faces 52 and 54. An epitaxial layer 56 has been deposited on the substrate 50 and etched to form the configuration shown. Electrical contact is made with the epitaxial material 56 by the contact metallization pads 58. A cross-sectional view of the structure of FIG. 6 is shown in FIG. 6a. The corresponding portions have been similarly labelled.

This technique is generally applicable to any substrate and superconducting material which are compatible, and in which the symmetry of the substrate and superconductor are different.

Using this invention, it is possible to make various angles of intersection of crystallographic faces. By starting with a crystal with an exterior face which is angled relative to the normal crystal faces, using the etch technique of this invention will result in angles of intersection which vary from those normally found in the crystal. For example, starting with a lanthanum aluminate crystal where the surface is angled, e.g., by 5°–30°, off the [110] plane towards the [010] plane, the angle of intersection of the surface with the etch exposed face will be decreased by that angle. In this way, virtually any angle of intersecting faces may be made.

Though the invention has been described with respect to specific preferred embodiments, many variations and modifications will become apparent to those skilled in the art. It is therefore the intention that the appended claims be interpreted as broadly as possible in view of the prior art to include all such variations and modifications.

What is claimed is:

1. A method for producing weak link junctions in an oxide superconductor on a substrate comprising the steps of:
   forming an epitaxial oxide superconductor film on a first face and,
   on a second face of the substrate, the second face being adjacent and not parallel to the first face, such that a planar fault is formed in the superconductor at the intersection of the first face and the second face.

2. The method of claim 1 for producing weak link junctions in an oxide superconductor on a substrate further comprising the step of patterning the superconductor.

3. The method of claim 2 for producing weak link junctions in an oxide superconductor wherein the superconductor is patterned by the steps of masking the superconductor and etching the unmasked areas.

4. The method of claim 2 wherein the masking step comprises photolithographic masking.

5. A method for forming crystallographic boundary junctions in an oxide superconductor on a substrate comprising the steps of:
   defining a first face on the surface of the substrate,
   forming a second face on the substrate such that a line of intersection is made between the first face and the second face, and
   forming an epitaxial oxide superconductor film over at least the adjacent portions of the first face and the second face such that a crystallographic boundary junction is formed in the superconductor at the line of intersection.

6. The method of claim 5 wherein the second face is formed by etching the substrate.

7. The method of claim 5 wherein the second face is formed by polishing the substrate.

8. The method of claim 6 wherein the etching is done by a chemical etchant.

9. The method of claim 8 wherein the etchant includes sulfuric acid.

10. The method of claim 8 wherein the etchant includes phosphorous acid.

11. The method of claim 6 wherein the oxide superconductor film is grown by vapor deposition techniques.

* * * * *

UNITED STATES PATENT AND TRADEMARK OFFICE
CERTIFICATE OF CORRECTION

PATENT NO. : 5,196,395

DATED : March 23, 1993

INVENTOR(S) : Timothy W. James et al

It is certified that error appears in the above-identified patent and that said Letters Patent is hereby corrected as shown below:

On title page, item [56]

In "References Cited", line 3, change "Josphehson" to --Josephson--.

In the "Abstract", line 5, change "etchant" to --etch--.

Column 1, line 64, change "thallium containing" to --thallium-containing--.

Column 2, line 5, change "thallium containing" to --thallium-containing--.

Column 2, line 6, change "Thallium containing" to --Thallium-containing--.

Column 3, line 12, change "repeatable" to --repeatedly--.

Column 4, line 11, change "a "V"-groove" to --a "V"-groove--.

Column 4, line 21, change "substrate" to --substrates--.

Column 4, line 50, change "a V-groove" to --a "V"-groove--.

Column 4, line 52, change "a V-groove" to --a "V"-groove--.

Column 4, line 53, before "serially", insert --a--.

Column 5, line 63, change "that" to --than--.

Column 5, line 68, change "such a" to --such as--.

UNITED STATES PATENT AND TRADEMARK OFFICE
CERTIFICATE OF CORRECTION

PATENT NO. : 5,196,395

DATED : March 23, 1993

INVENTOR(S) : Timothy W. James et al

It is certified that error appears in the above-identified patent and that said Letters Patent is hereby corrected as shown below:

Column 6, line 24, change "describe" to --described--.

Column 6, line 36, after "sided", insert --faces--.

Column 7, Claim 1, line 41, change "first face and, on" to --first face and on--.

Signed and Sealed this

Twelfth Day of April, 1994

BRUCE LEHMAN

*Commissioner of Patents and Trademarks*

*Attest:*

*Attesting Officer*